US009847620B2

(12) United States Patent
Wang et al.

(10) Patent No.: US 9,847,620 B2
(45) Date of Patent: Dec. 19, 2017

(54) LASER DRIVER, DRIVING METHOD, AND HIGH-SPEED OPTICAL MODULE

(71) Applicant: InnoLight Technology (Suzhou) LTD., Suzhou, Jiangsu (CN)

(72) Inventors: Xiangzhong Wang, Jiangsu (CN); Meng Fang, Jiangsu (CN)

(73) Assignee: InnoLight Technology (Suzhou) LTD., Suzhou (CN)

( * ) Notice: Subject to any disclaimer, the term of this patent is extended or adjusted under 35 U.S.C. 154(b) by 0 days.

(21) Appl. No.: 15/369,243

(22) Filed: Dec. 5, 2016

(65) Prior Publication Data

US 2017/0170626 A1    Jun. 15, 2017

(30) Foreign Application Priority Data

Dec. 15, 2015    (CN) .......................... 2015 1 0939636

(51) Int. Cl.
| | |
|---|---|
| *H01S 5/026* | (2006.01) |
| *H01S 5/022* | (2006.01) |
| *H01S 5/40* | (2006.01) |
| *H01S 5/068* | (2006.01) |
| *H01S 5/0683* | (2006.01) |
| *H01S 5/042* | (2006.01) |

(52) U.S. Cl.
CPC ........ *H01S 5/0261* (2013.01); *H01S 5/02248* (2013.01); *H01S 5/06808* (2013.01); *H01S 5/06832* (2013.01); *H01S 5/4025* (2013.01); *H01S 5/0427* (2013.01)

(58) Field of Classification Search
CPC .. H01S 5/0261; H01S 5/4025; H01S 5/02248; H01S 5/042; H01S 5/06832; H01S 5/06808; H01S 5/0427
See application file for complete search history.

(56) References Cited

U.S. PATENT DOCUMENTS

| | | | |
|---|---|---|---|
| 6,822,987 B2 | 11/2004 | Diaz et al. | |
| 2005/0185428 A1* | 8/2005 | Crawford | ........... H05B 33/0818 363/21.06 |

FOREIGN PATENT DOCUMENTS

CN         1972541 A       5/2007

* cited by examiner

*Primary Examiner* — Xinning Niu
(74) *Attorney, Agent, or Firm* — Finnegan, Henderson, Farabow, Garrett & Dunner, LLP (57) ABSTRACT

A laser driver for a laser, which includes an adjustable DC-DC power source, an optical power control loop, and a power source voltage regulator. The adjustable DC-DC power source is coupled to the optical power control loop and the power source voltage regulator, in order to provide a working current for the laser. The optical power control loop is configured to adjust the output optical power of the laser to a set value for optical power by adjusting a working voltage of the laser, and to generate a power source voltage state indicator voltage. The power source voltage regulator is used to generate the power source setting voltage, so that the power source voltage state indicator voltage is greater than or equal to a first preset threshold, or less than or equal to a second preset threshold.

7 Claims, 10 Drawing Sheets

LASER DRIVER, DRIVING METHOD, AND HIGH-SPEED OPTICAL MODULE

CROSS REFERENCE TO RELATED APPLICATIONS

This application is based upon and claims the benefit of priority from prior Chinese Patent Application No. 201510939636.7 filed on Dec. 15, 2015, the entire contents of which are incorporated herein by reference.

FIELD OF THE DISCLOSURE

This disclosure relates to the field of optical information transmission devices and, more particularly, to a laser driver, a driving method, and a high-speed optical module.

BACKGROUND

In the field of high-speed optical communications, optical modules such as a 100 Gbps (4×25 Gbps) module with a transmission distance of 10 km are usually implemented by four electro-absorptive modulated lasers. Therefore, the optical module includes multiple laser direct-current bias driving circuits, and each driving circuit controls an output optical power of a respective one of the four electro-absorptive modulated lasers. For a driving circuit, the main challenges are to realize low power consumption and small size.

Figure 1:
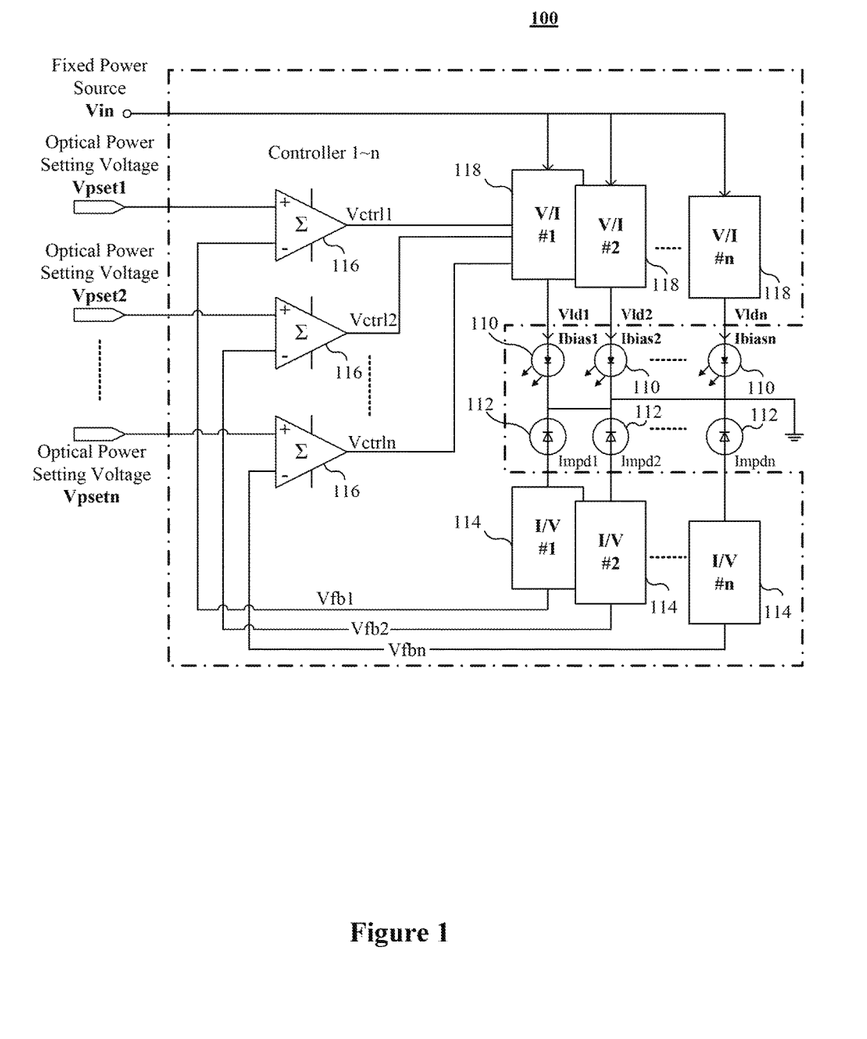
FIG. 1 is a circuit diagram of a conventional laser driving circuit.

FIG. 1 is a circuit diagram of a conventional laser driving circuit 100. The conventional laser driving circuit 100 is characterized by the following.

First, the laser driving circuit 100 includes one or more automatic optical power control loops. In each loop, an output optical power of a laser 110 is detected by a photodiode 112, and a photoelectric current Impdk (k=1, 2, . . . , n) is generated accordingly. Then, an I/V converter circuit 114 is used to generate a feedback voltage signal Vfbk (k=1, 2, . . . , n) that is proportional to the laser's output optical power. The feedback voltage signal Vfbk is fed into a controller 116, in which the feedback voltage signal Vfbk is compared to an optical power setting voltage Vpsetk (k=1, 2, . . . , n) to obtain a deviation signal, which is processed by an integral control calculation to obtain a control voltage Vctrlk (k=1, 2, . . . , n). Furthermore, a V/I-converter laser current driving circuit (#1, #2, . . . or #n) 118 is used to convert the control voltage Vctrlk to a corresponding laser driving current Ibiask (k=1, 2, . . . , n).

Second, the laser driving circuit 100 uses a direct-current fixed power source to supply a working voltage Vin for one or more V/I-converter laser driving circuits.

Figure 2:
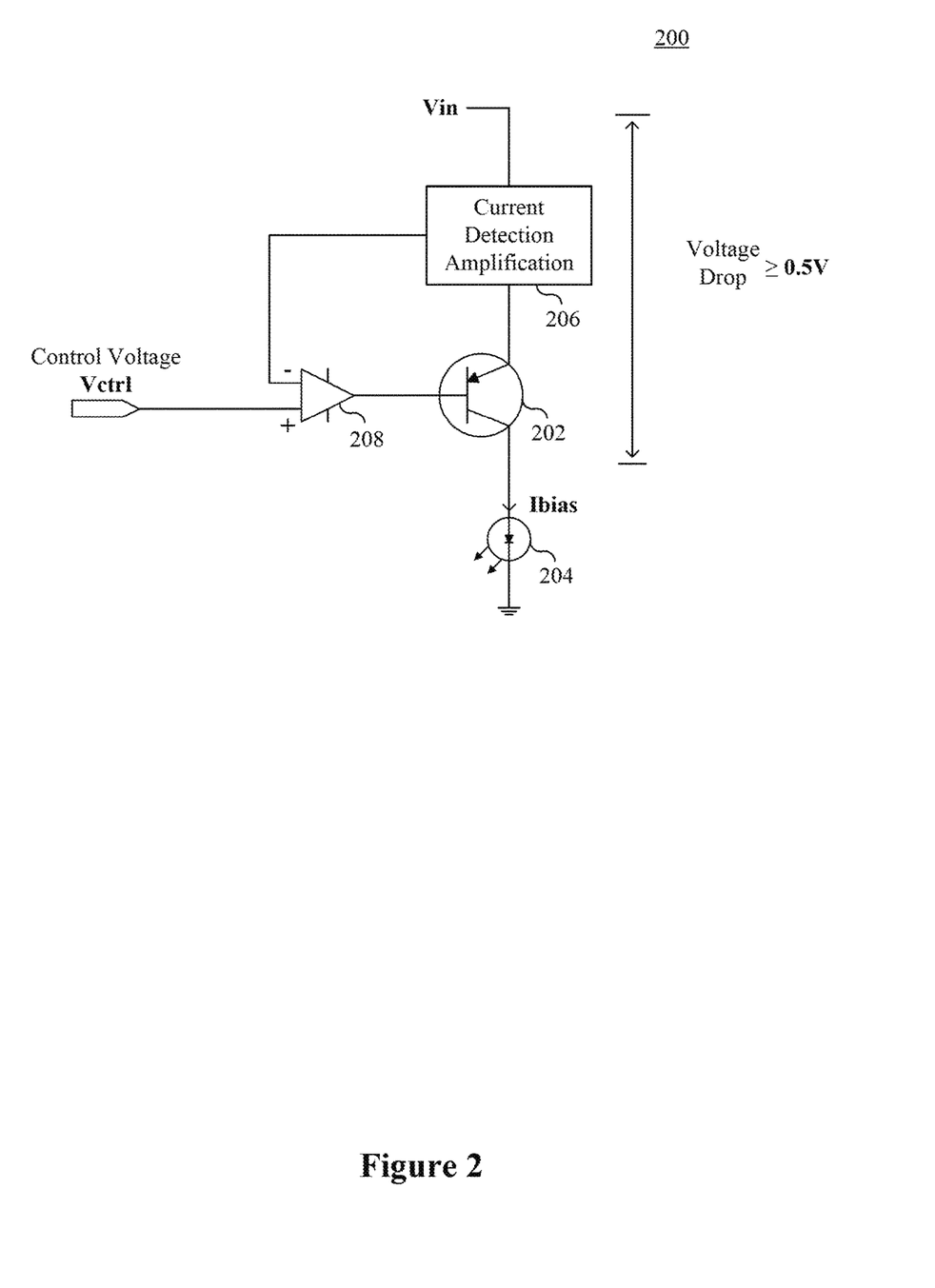
FIG. 2 is a circuit diagram of a typical V/I-converter laser driving circuit.

FIG. 2 is a circuit diagram of a typical V/I-converter laser current driving circuit 200. In the V/I-converter laser driving circuit 200, a bipolar junction transistor (BJT) or field-effect transistor (FET) 202 is used on an output end to drive a load of a laser 204. An output loop of the V/I-converter laser driving circuit 200 includes a current detection amplification circuit 206 that detects a current to generate a negative feedback voltage signal which is proportional to the detected current. The negative feedback voltage is compared with the control voltage signal Vctrl. An operational amplifier 208 is used to realize the V/I conversion.

A problem with the conventional laser driving circuit is that a relatively high output voltage V+ needs to be configured for the fixed power source to meet the operating requirements of all of the lasers in an optical module, because the operating voltage of each laser varies significantly from batch to batch and changes with the output power setting. A relatively high output voltage leads to relatively high power consumption, of which a large portion is wasted in the driving circuit, and thus power consumption by the driving circuit is not optimized. This is because: V+=Vdrop+Vld, where Vdrop is the voltage drop generated by an output driving transistor, e.g., transistor 202, and current detection amplification circuit, e.g., circuit 206. In order to ensure the proper operation of the driving circuit and obtain good linearity in the V/I conversion, Vdrop usually needs to be 0.5 V or above (i.e., Vdrop(min)=0.5 V). Vld is the laser's voltage drop. Vld=Vld0+Ild*Rld. Vld0 is the laser's breakdown threshold voltage (usually about 1 V), Rld is the laser's direct-current internal resistance (usually 8-15 ohm), and Ild is the laser's current (usually 0-100 mA). Rld increases as the laser's operating temperature increases, and Ild changes with the laser's output power setting.

From the perspective of circuit design, in order to ensure that all lasers can operate over the entire operating temperature range, the output voltage of the direct-current fixed power source must be set to be no lower than V+(min)=Vdrop(min) +Vld(max). The ranges for the parameters above are known, for example, V+(min)=0.5V+ (1.0V+100 mA*15 ohm)=3.0 V. In such a circuit configuration, for lasers with low internal resistance and high efficiency, such as one where Rld=8 ohm and Ild=50 mA, Vld=1.4 V, Vdrop=V+−Vld=1.6 V, and the laser's power consumption Pld=Vld *Ild=1.4 V*50 mA=70 mW, and the wasted power Plost=Vdrop*Ild=1.6 V*50 mA=80 mW. In particular, high-speed optical modules such as an 100GLR4 usually have at least 4 channels of lasers, so the total power wasted reaches 80 mW*4=320 mW, which cannot be neglected if the target power consumption of the high-speed optical module is expected to be kept under 0.5 W.

SUMMARY

In accordance with the present disclosure, there is provided a laser driver for a laser, which includes an adjustable DC-DC power source, an optical power control loop, and a power source voltage regulator. The adjustable DC-DC power source is coupled to the optical power control loop and the power source voltage regulator, in order to provide a working current for the laser, and an output voltage of the adjustable DC-DC power source changes as the power source setting voltage changes. The optical power control loop is configured to adjust an output optical power of the laser to a set value for optical power by adjusting a working voltage of the laser, and to generate a power source voltage state indicator voltage. The power source voltage regulator is used to generate the power source setting voltage, so that the power source voltage state indicator voltage is greater than or equal to a first preset threshold, or less than or equal to a second preset threshold.

Also in accordance with the present disclosure, there is provided a laser driving method, which includes: providing an adjustable DC-DC power source coupled to a first controller and a second controller; providing, by the adjustable DC-DC power source, a working current for the laser, an output voltage of the adjustable DC-DC power source changing as a power source setting voltage changes; adjusting, by the first controller, an output optical power of the laser to a set value of the optical power by adjusting a working voltage of the laser, and to generate a power source voltage state indicator voltage; and causing, by the second controller, the power source voltage state indicator voltage to be greater than or equal to a first preset threshold, or less than or equal to a second preset threshold, by adjusting the output voltage.

BRIEF DESCRIPTION OF THE DRAWINGS

As one reads and references the detailed descriptions of non-limiting embodiments accompanied by the drawings, other characteristics, purposes, and advantages of the invention will become more evident.

The same or similar markings in the drawings represent the same or similar parts.

DETAILED DESCRIPTION

For a better understanding and explanation of this disclosure, a description with further details about this invention is provided below, in reference to the attached drawings.

Figure 3:
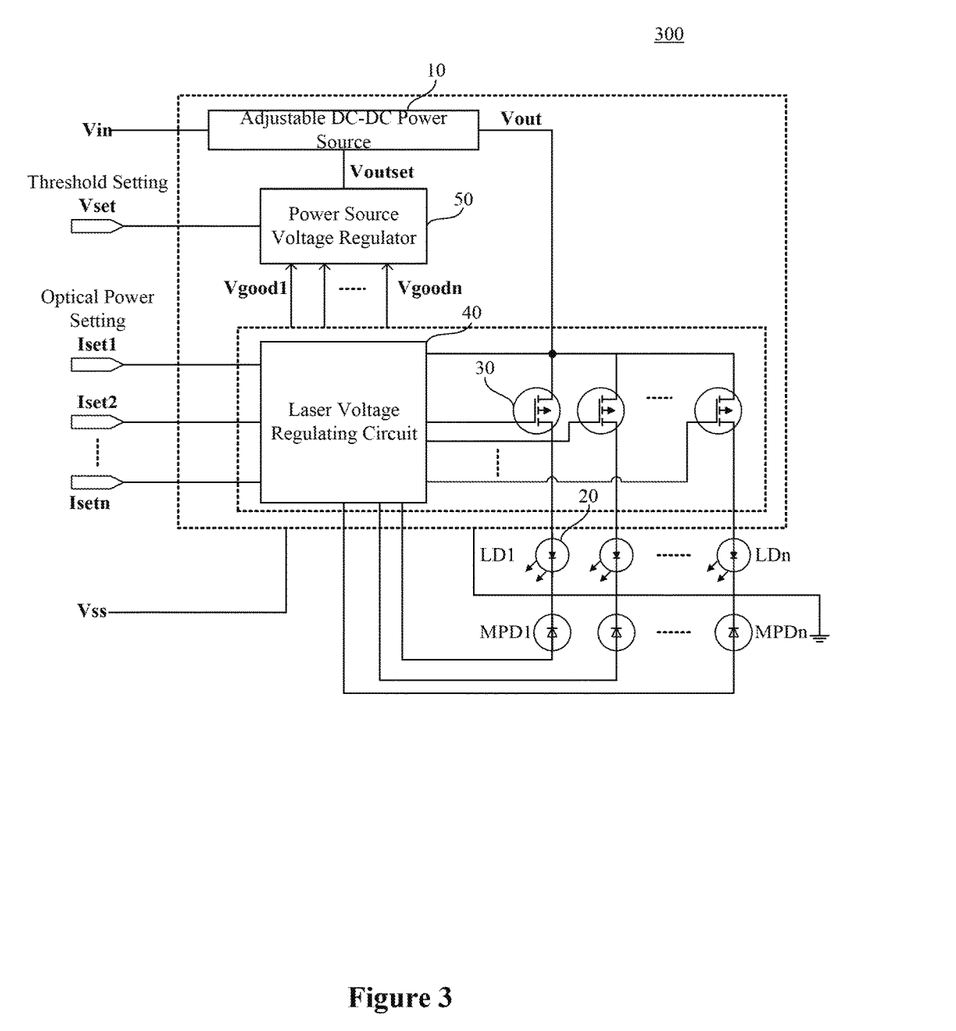
FIG. 3 is a schematic diagram of a laser driver according to an illustrated embodiment of the present disclosure.

FIG. 3 is a schematic diagram of a laser driver 300 for driving a laser, according to an illustrated embodiment of the present disclosure. The laser driver 300 includes an adjustable DC-DC power source 10, one or more optical power control loops, and a power source voltage regulator 50.

The adjustable DC-DC power source 10 is configured to be connected to the optical power control loops and the power source voltage regulator 50, in order to provide a working current for the laser, which includes one or more laser devices, such as laser diodes LDk 20, k=1, 2, ..., n, respectively corresponding to the one or more optical power control loops. An output voltage Vout of the adjustable DC-DC power source 10 changes as a power source setting voltage Voutset changes.

Each one of the one or more optical power control loops is configured to adjust an output optical power of a corresponding one of the one or more laser diodes LDk 20 to a set value for optical power by modifying a working voltage of the corresponding laser diode LDk 20. Each one of the plurality of optical power control loops is also configured to generate a power source voltage state indicator voltage Vgoodk (k=1, 2, ..., n), for the purpose of indicating whether the output voltage Vout is causing the corresponding laser diode LDk 20 to work properly.

The power source voltage regulator 50 is used to generate the power source setting voltage Voutset, so that all of the power source voltage state indicator voltages Vgoodk are greater than or equal to a first preset threshold, or less than or equal to a second preset threshold.

In a laser array composed of multiple laser devices, one or multiple ones of the laser devices may be driven by using the laser driver provided according to the embodiment of the present disclosure. Those skilled in the art will now understand that FIG. 3 shows not only the structure of the laser driver provided according to the embodiment of the present disclosure, but also the local structure related to a laser driving circuit of the laser array mentioned above.

Referring to FIG. 3, each optical power control loop includes a laser driving transistor (e.g., transistor 30) and a laser voltage regulating circuit 40. Additionally, the optical power control loop also includes a controlled object (e.g., laser diode LDk 20) and a photoelectric current monitor device (e.g., one of monitor photodiodes MPDk, k=1, 2, ..., n). The laser driving transistor 30 can be provided as a BJT or FET.

The laser driving transistor 30 is configured to be connected in series between the adjustable DC-DC powersource 10 and the laser diode LDk 20, for the purpose of adjusting a voltage drop across the laser driving transistor 30 by modifying the base voltage or gate voltage of the laser driving transistor 30, in order to change the output optical power of the laser diode LDk 20.

The laser voltage regulating circuit 40 is configured to be connected to the laser diode LDk 20, the laser driving transistor 30, and the power source voltage regulator 50, for the purpose of detecting the output optical power of the laser diode LDk 20 and generating the base voltage or gate voltage of the laser driving transistor 30 based on the detected output optical power.

The power source voltage state indicator voltage Vgood is generated by the laser driving transistor 30 or the laser voltage regulating circuit 40.

Typically, the first preset threshold or the second preset threshold is determined based on a threshold setting signal Vset. The value of the threshold setting signal Vset enables the output voltage Vout to be the minimum voltage needed to ensure the proper functioning of the laser diode LDk.

Figure 4:
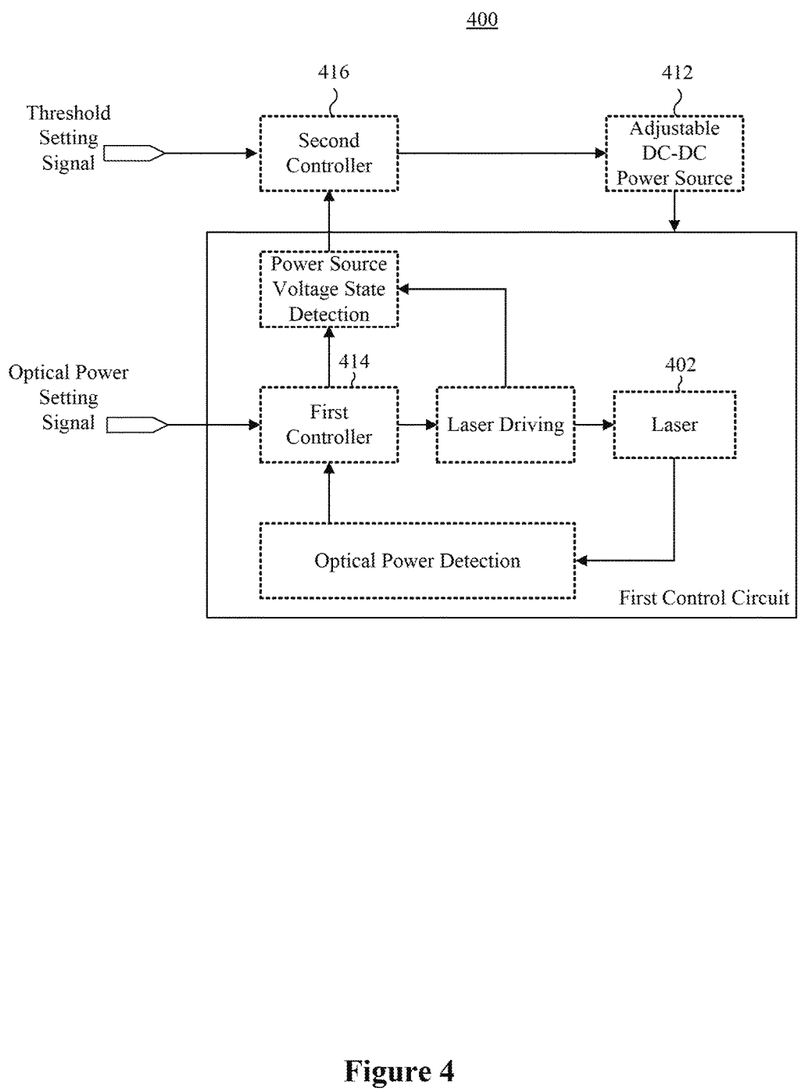
FIG. 4 is a schematic diagram of an optical module for implementing a laser driving method according to an illustrated embodiment of the present disclosure.

The present disclosure also provides a laser driving method for driving a laser. FIG. 4 is a schematic diagram of an optical module 400 for implementing a laser driving method for driving a laser 402 according to an embodiment of the present disclosure. The laser driving method includes the following steps.

First, an adjustable DC-DC power source 412 is provided to be connected to a first controller 414 and a second controller 416.

Then, the adjustable DC-DC power source 412 is configured to provide a working current for the laser 402. An output voltage of the adjustable DC-DC power source 412 changes as a power source setting voltage changes.

The first controller 414 is configured to adjust an output optical power of the laser 402 to a set value of the optical power by modifying the working voltage of the laser 402, and to generate a powersource voltage state indicator voltage for indicating whether the output voltage is causing the laser 402 to work properly.

The second controller 416 is configured to cause the power source voltage state indicator voltage to be greater than or equal to the first preset threshold, or smaller than or equal to the second preset threshold, by modifying the output voltage of the adjustable DC-DC power source 412.

The laser driving method according to the embodiment can be implemented by the laser driver shown in FIG. 3. The first controller can be implemented by the laser voltage regulating circuit 40 in FIG. 3. The second controller can be implemented by the power source voltage regulator 50 in FIG. 3. The structure shown in FIG. 4 can be considered a simplified logic structural diagram based on FIG. 3.

In one embodiment, in the laser driving method, the second controller 416 includes an integrator and a voltage selector. The power source voltage state indicator voltage is configured to change in the same direction as the output voltage of the adjustable DC-DC power source 412. When the power source voltage state indicator voltage is greater than or equal to the first preset threshold, the optical power control loop operates normally. The integrator is configured to integrate a difference between the first preset threshold and the power source voltage state indicator voltage. The voltage selector is configured to select the highest output voltage among the output voltages of the integrator to set the power source setting voltage. The output voltage of the adjustable DC-DC power source is configured to change in the same direction as the power source setting voltage. The integrator is configured to continually adjust the output voltage until the power source voltage state indicator voltage is no less than the first preset threshold.

In another embodiment, the second controller 416 includes an integrator and a voltage selector. The power source voltage state indicator voltage is configured to change in the same direction as the output voltage of the adjustable DC-DC power source 412. When the power source voltage state indicator voltage is less than or equal to the second preset threshold, the optical power control loop operates normally. The integrator is configured to integrate a difference between the second preset threshold and the power source voltage state indicator voltage. The voltage selector is configured to select the lowest output voltage among the output voltages of the integrator to set the power source setting voltage. The output voltage is configured to change in the opposite direction as the power source setting signal. The integrator is also configured to continually adjust the output voltage until the power source voltage state indicator voltage is no greater than the second preset threshold.

The first preset threshold or the second preset threshold is determined based on a threshold setting signal. The value of the first preset threshold or the second preset threshold enables the output voltage to be the minimum voltage needed to ensure the normal operation of the optical power control loop.

Referring to FIG. 3 again, a further description of the laser driver and the laser driving method according to the embodiment of the present disclosure is provided. A backward optical power of the laser diode LDk emitted in a backward direction is coupled with the photodiode MPDk to generate a photoelectric current, whose magnitude is proportional to a forward optical power of the laser diode LDk emitted in the forward direction. Therefore, the optical power emitted by the laser diode LDk can be controlled by controlling the photoelectric current of the photodiode MPDk. The laser voltage regulating circuit 40 performs a negative feedback control of the optical power of the laser diode LDk. The laser voltage regulating circuit 40 subtracts a corresponding one of optical power setting currents Isetk (k=1, 2, . . . , n) from the detected MPD photoelectric current to obtain an error current, and converts the error current to a voltage signal for amplification, resulting in a driving voltage of the laser driving transistor 30. If the laser driving transistor 30 is a PNP bipolar junction transistor, the driving voltage is connected to the base terminal of the laser driving transistor 30; and if the laser driving transistor 30 is a P-Channel MOSFET, the driving voltage is connected to the gate terminal of the laser driving transistor 30. When the optical power of the laser diode LDk 20 decreases, the photoelectric current of the photodiode MPDk decreases, the error current decreases, the driving voltage decreases, and the laser current (also the current through the transistor) increases, resulting in an increase of the optical power; and vice versa. In a stable state, this negative feedback regulating loop of the laser voltage can stabilize an emitting power of the laser diode LDk 20 at the value corresponding to the optical power setting current Iset, and the emitting power of the laser diode LDk 20 can be adjusted by modifying Iset.

A direct-current model of the laser diode LDk 20 can be considered as an ideal diode connected in series with an internal resistor, in which the driving voltage of the laser diode LDk 20 must be greater than the threshold voltage of the ideal diode for the current to flow through the laser diode LDk 20. Once the laser diode LDk 20 becomes conductive, its voltage drop increases approximately in a linear manner as the current of the laser diode LDk 20 increases. It is assumed the expected emitting optical power of the laser diode LDk 20 that corresponds to the optical power setting current Iset is Pld0, and the corresponding current and voltage drop of the laser diode LDk 20 are Ild0 and Vld0, respectively. When the output voltage Vout of the adjustable DC-DC power source 10 is greater than Vld0, the laser voltage regulating circuit 40 generates a corresponding transistor driving voltage Vctrl so that the output voltage drop of the laser driving transistor 30 equals Vout−Vld0, thus the voltage drop of the laser diode LDk 20 is Vout−(Vout−Vld0)=Vld0. However, if Vout<Vld0, the laser voltage regulating circuit 40 generates a minimum transistor driving voltage (Vctrl_min) that makes the laser driving transistor 30 go into a saturated state. In this scenario, the actual voltage drop of the laser diode LDk 20 is a difference between Vout and the transistor saturation voltage Vsat, i.e., Vout−Vsat, which is less than the expected value Vld0. As a result, the output optical power of the laser diode LDk 20 cannot be sustained at Pld0. The driving voltage Vctrl and output voltage Vld (to the laser diode LDk 20) of the laser driving transistor 30 change as the output voltage Vout of the power source 10 changes. By detecting the value of the current voltage on either end of the laser driving transistor 30, it can be determined whether the power source voltage Vout is too low for the laser diode LDk 20 to operate normally, or if the power source voltage Vout is too high to result in unnecessary waste.

Figure 5A:
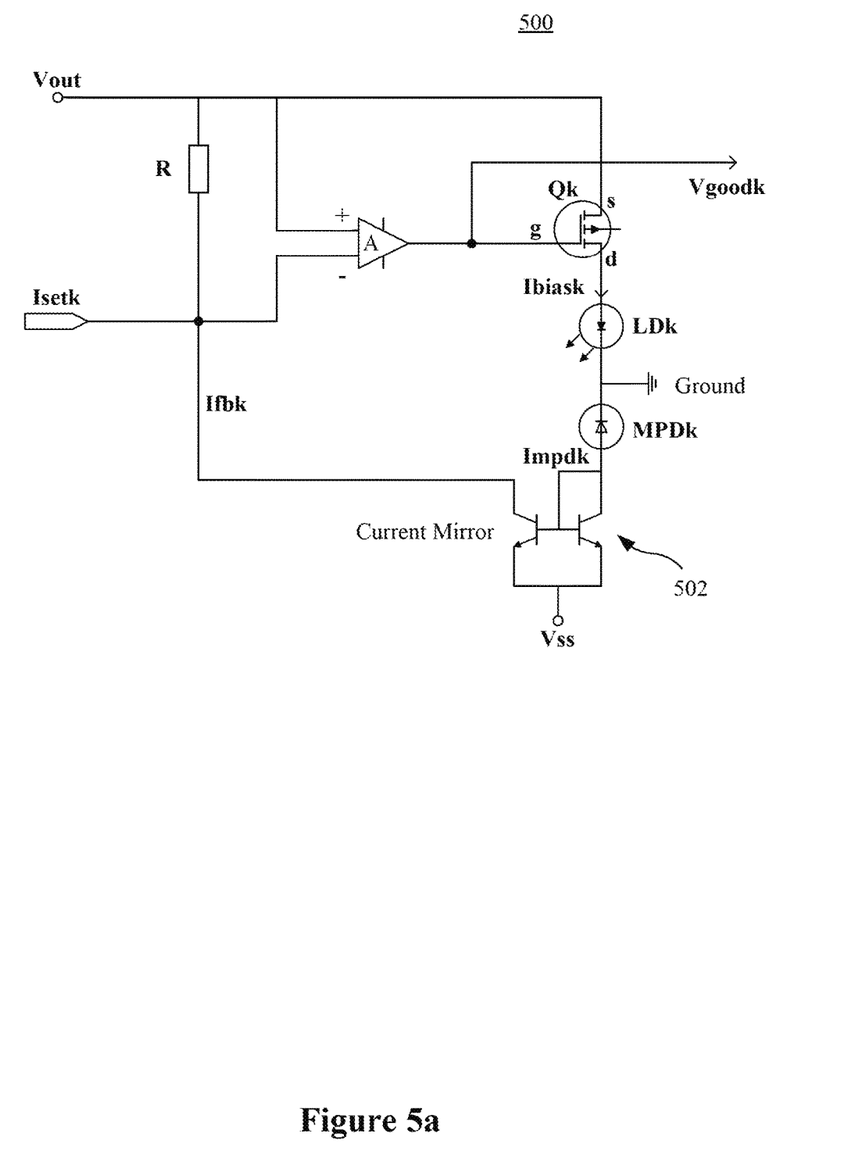
FIG. 5a is a schematic diagram of a laser voltage regulating circuit according to an illustrated embodiment of the present disclosure.
Figure 5B:
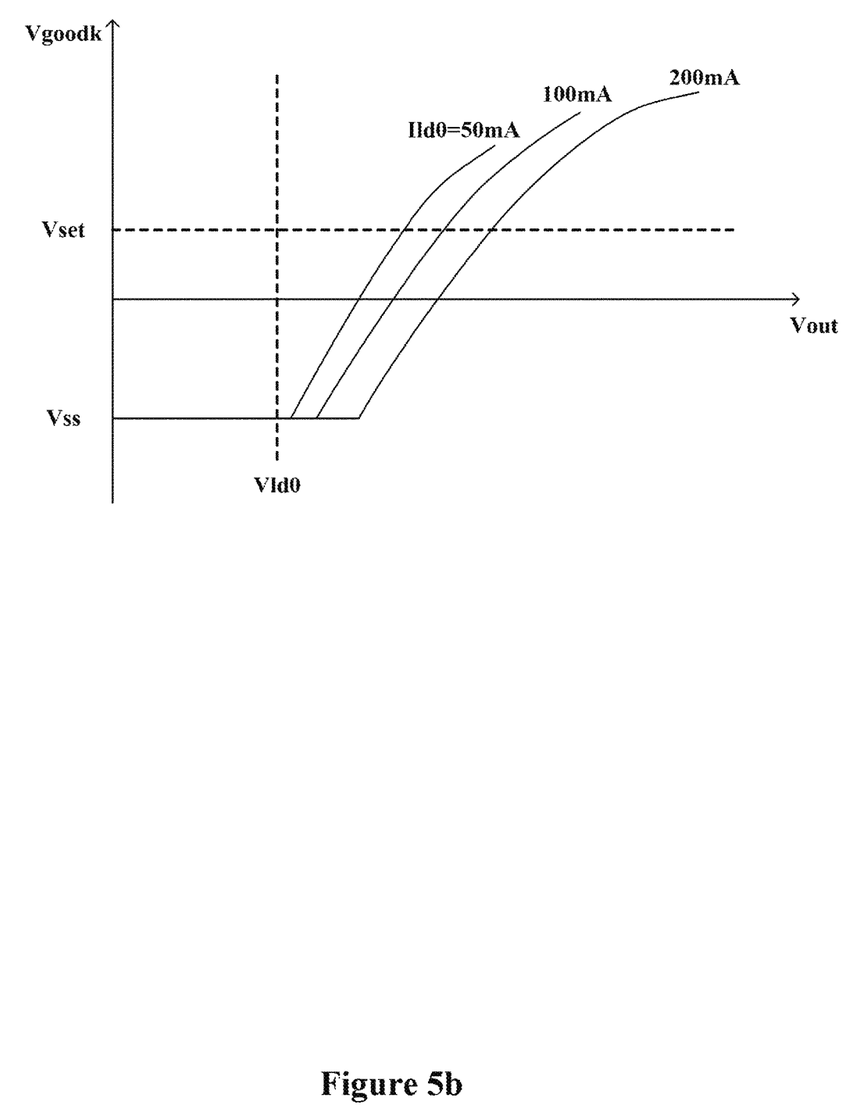
FIG. 5b is a graph showing a correspondence between Vout and Vgoodk at different Ild0.

FIG. 5a is a schematic diagram of a laser voltage regulating circuit 500, according to an illustrated embodiment of the present disclosure. FIG. 5b is a graph showing a correspondence between Vout and Vgoodk at different values of Ild0. In this embodiment, a negative terminal of a laser diode LDk and a negative terminal of a photodiode MPDk are grounded. The photoelectric current Impdk of the MPDk is coupled to a current mirror 502, resulting in a feedback current Ifbk, which is equal to Impdk. The difference (i.e., error current) between a setting current Isetk and the feedback current Ifbk produces a voltage drop (i.e., error voltage) on a resistor R. The error voltage is amplified by an amplifier A before it is applied to a driving MOSFET transistor Qk. When the optical power of the laser diode LDk decreases, Ifbk decreases, the error voltage decreases, the Qk gate voltage increases, the Qk output voltage drop decreases, and the laser voltage increases, resulting in an increase in the photoelectric current and optical power of the laser diode LDk; and vice versa. Therefore, when the power source voltage Vout is high enough, this negative feedback control loop is able to control the optical power so that it stays at a value corresponding to the setting value Isetk. Vgoodk is tapped at the gate of the driving transistor Qk, and Vgoodk increases as the power source voltage Vout increases.

As shown in FIG. 5b, when the power source voltage Vout is high enough to enable all laser channels to operate properly, Vgoodk is kept within a certain range below the power source voltage Vout (depending on the type of the driving transistor) and changes in the same direction as the power source voltage Vout changes. However, if the power source voltage Vout is too low to supply the working voltage for a certain laser, the corresponding driving circuit will become saturated, causing a rapid decline in Vgoodk. Therefore, the goal of the power source voltage regulator is to maintain the power source voltage so that all power source voltage state indicator signals Vgoodk are greater than or equal to the minimum voltage of the preset Vset. That is, the first preset threshold equals the lower limit of the power source voltage state indicator voltage Vgoodk, and its value can be the same as that of Vset.

Figure 6A:
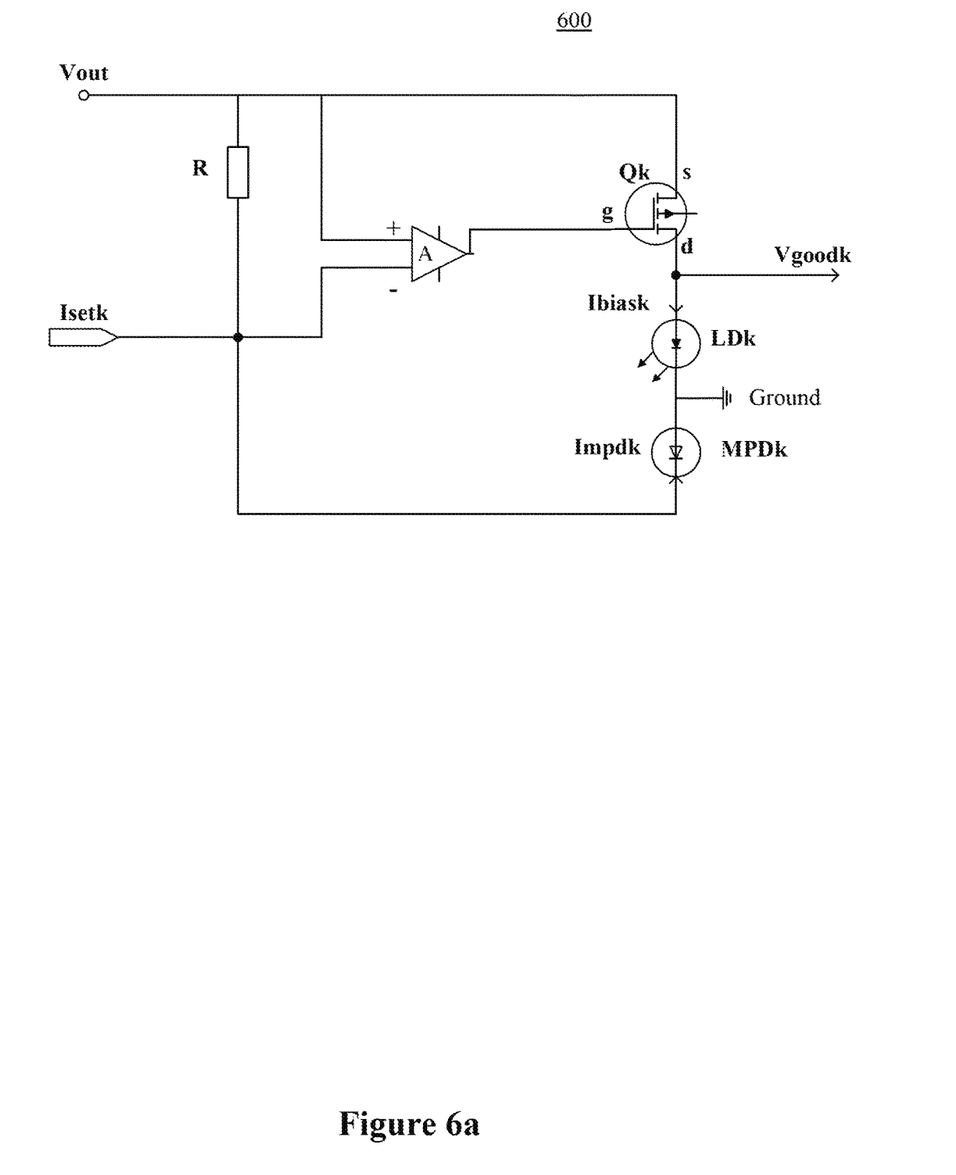
FIG. 6a is a schematic diagram of a laser voltage regulating circuit according to an illustrated embodiment of the present disclosure.
Figure 6B:
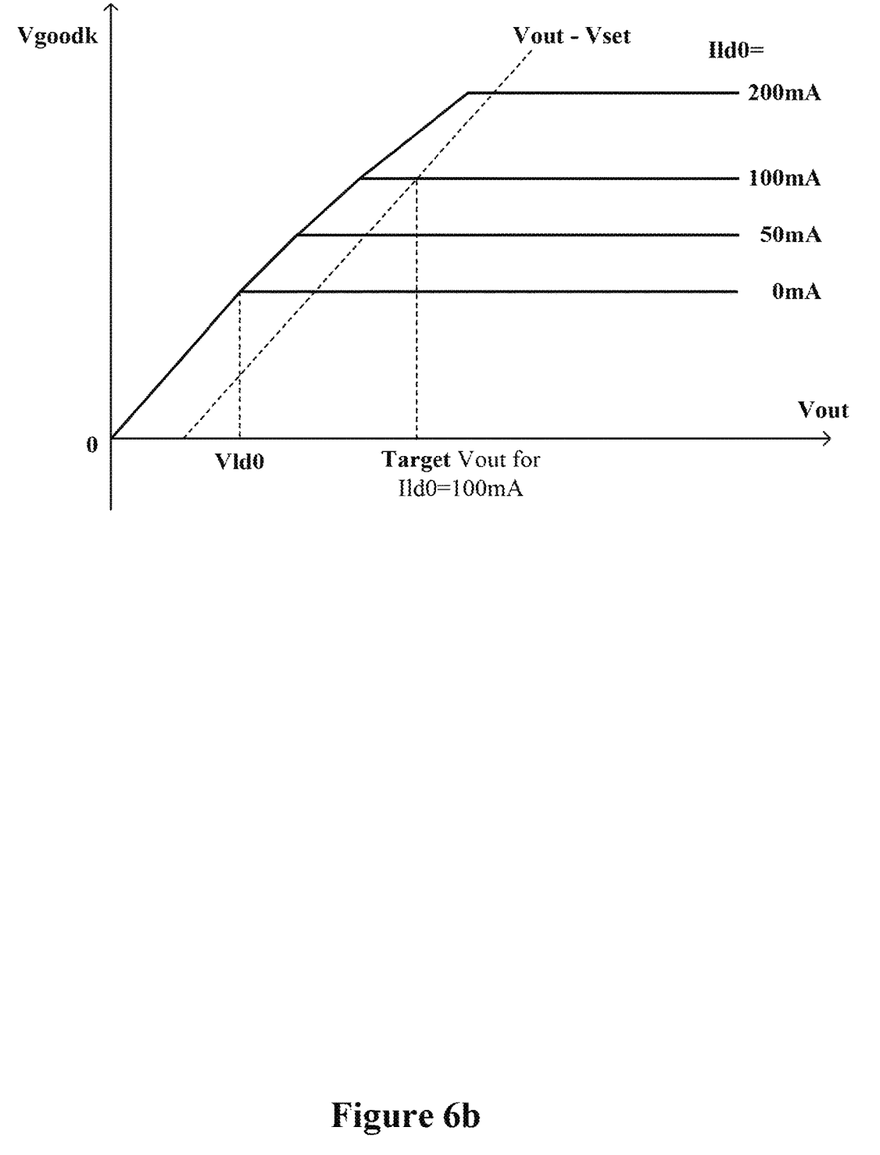
FIG. 6b graph showing a correspondence between Vout and Vgoodk at different Ild0.

FIG. 6a is a schematic diagram of a laser voltage regulating circuit 600, according to another illustrated embodiment of the present disclosure. FIG. 6b is a graph showing a correspondence between Vout and Vgoodk at different values of Ild0. In this embodiment, the photodiode MPDk has its positive terminal grounded, and a photoelectric current Impdk of the MPDk as a feedback current is compared directly to the setting current Isetk. The difference (i.e., error current) between the set current Isetk and the feedback current Impdk generates a voltage drop (i.e., error voltage) on the resistor R. The error voltage is amplified by the amplifier A before it is applied to the driving MOSFET transistor Qk. When the optical power of the laser diode LDk decreases, Impdk decreases, the error voltage decreases, the Qk gate voltage increases, the Qk output voltage drop decreases, and the laser voltage increases, resulting in an increase in the photoelectric current and optical power of the laser diode LDk; and vice versa. Therefore, when the power source voltage Vout is high enough, this negative feedback control loop is able to control the optical power so that it stays at a value corresponding to the setting value Isetk. Vgoodk is tapped at the output terminal of the driving transistor Qk.

As shown in FIG. 6b, when the power source voltage Vout is too low, causing the laser current to be too low and the output optical power to be lower than a set value, the driving transistor is in a saturated state, and Vgoodk is approximately equal to Vout−Vsat, where Vsat is the saturation voltage of the driving transistor Qk. In this scenario, Vgoodk increases or decreases in the same direction as Vout. When Vout is high enough to enable the optical power control loop to operate normally, the laser current becomes stable, and Vgoodk also stabilizes at the voltage value that corresponds to the optical power's set value. The state of the power source is indicated based on the voltage drop between Vgoodk and Vout (i.e., the output voltage drop of the driving transistor Qk): Vgoodk'=Vout−Vgoodk. If Vgoodk' is too high, it indicates that the power source voltage Vout is greater than what is needed for the laser diode LDk to operate, and the power source voltage Vout can be lowered to decrease power consumption. If Vgoodk' is too low, it indicates that the driving circuit is saturated, and the power source voltage Vout needs to be increased because it is not sufficient to cause the laser diode LDk to operate properly.

The goal of the power source voltage regulator is to maintain the power source voltage Vout so that all Vgoodk' are greater than the minimum value of a certain preset voltage drop Vset, that is, all Vgoodk are less than or equal to the minimum value of Vout Vset. That is, the second preset threshold equals the upper limit of the power source voltage state indicator voltage Vgoodk, and its value can be the same as that of Vout−Vset.

Figure 7:
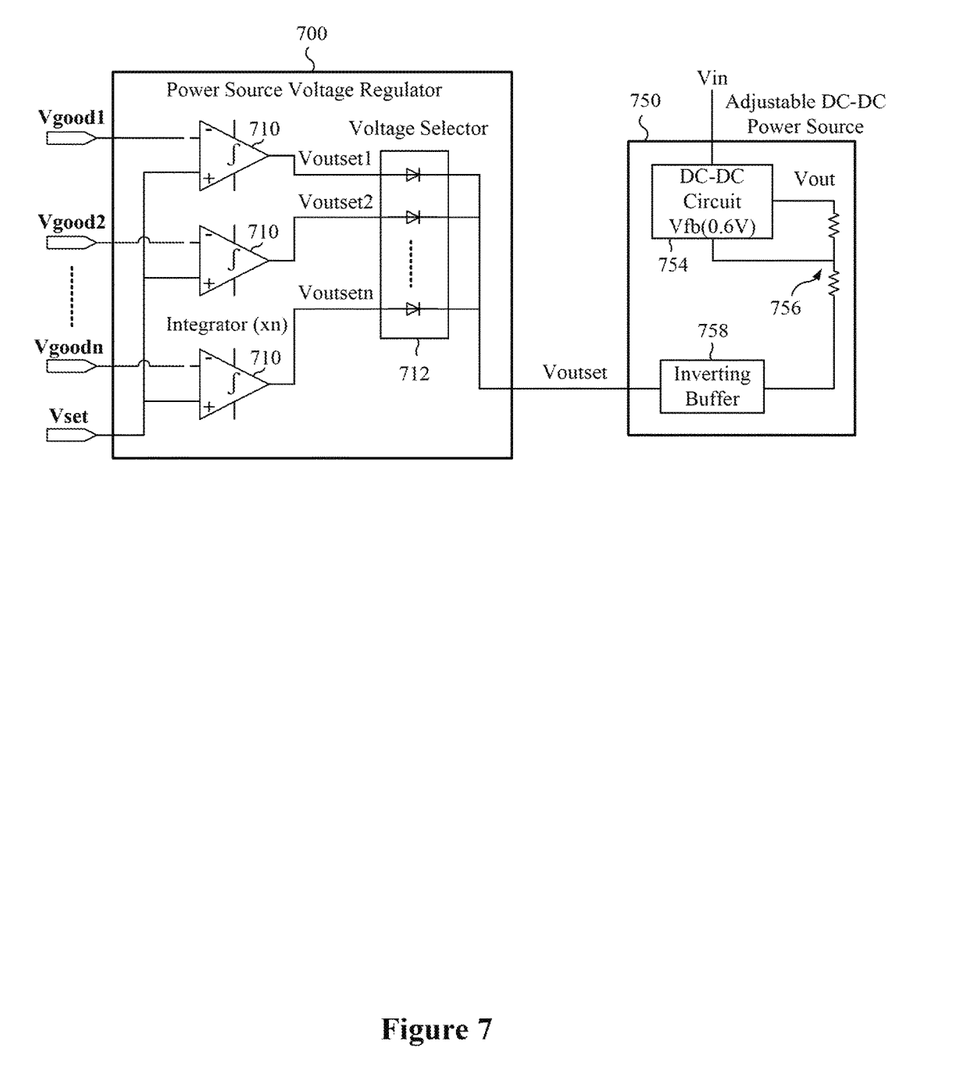
FIG. 7 is a schematic diagram of a power source voltage regulator according to an illustrated embodiment of the present disclosure.

FIG. 7 is a schematic diagram of a power source voltage regulator 700, according to an illustrated embodiment of the present disclosure. This embodiment can be used in conjunction with the embodiment of the laser voltage regulating circuit 500 shown in FIG. 5a. In this embodiment, an adjustable DC-DC power source 750 can be realized using a common DC-DC converter circuit 754 with a feedback input end Vfb, together with a resistor voltage dividing network 756 and an inverting buffer 758 (e.g., an operational amplifier whose gain equals −1). The adjustable DC-DC power source 754 can have a conventional structure such that its working mechanism is apparent to those skilled in the art, and an explanation of its detailed structure is not included in this disclosure. In the embodiment shown in FIG. 7, Vset is the threshold setting signal (FIG. 3), and the first preset threshold=the threshold setting signal. As the input signal for the power source voltage regulator 700, Vset is used to set the minimum working voltage for each power source state indicator signal Vgoodk (k=1 . . . n). The function of the power source voltage regulator 700 is to change the output voltage Vout of the adjustable DC-DC power source 750 to stabilize the minimum among Vgoodk at Vset and maintain the other Vgoodk above Vset. In this embodiment, the power source voltage regulator 700 includes a plurality of integrators 710, a voltage selector 712, as well as the inverting buffer 758 of the adjustable DC-DC power source 750. The voltage selector 712 includes an array made up of diodes with the same V/I characteristics and respectively corresponding to the integrators 710. The positive terminal of each diode is connected to its corresponding integrator 710, and the negative terminal of each diode is connected in parallel as the output of the voltage selector 712. Since the diode goes into an off-state when reversed, the output voltage of the voltage selector 712 will increase or decrease with the highest one (denoted as Voutset,max) among Voutsetk (k =1 . . . n), and the other lower Voutsetk (max≠k) will have very little or negligible influence on the output voltage of the voltage selector 712. Each integrator 710 integrates a difference between Vset and Vgoodk, with its negative input receiving the Vgoodk signal and its positive input receiving Vset. If a certain Vgoodk is lower than Vset, the corresponding output voltage Voutsetk from the integrator 710 will increase until it becomes Voutset,max, which is greater than all the other output voltages from the integrators 710, leading to an increase in the output voltage of the voltage selector 712, which decreases Voutset through the inverting buffer 758, and ultimately increases the output voltage Vout from the adjustable DC-DC power source 750 (to ensure Vfb stabilizes at 0.6V). And, the increase in Vout leads to an increase in Vgoodk until it is greater than or equal to Vset.

The analysis above shows that Vgoodk will not be less than Vset in a stable state. Below is an analysis of the scenario where all Vgoodk are greater than Vset. In this scenario, the output voltage of each integrator 710 decreases gradually, and the output of the power source selector 712 decreases as Voutset,max decreases, causing the output voltage Vout of the adjustable DC-DC power source 750 to decrease, which results in a decrease among all Vgoodk.

This process continues until the lowest of Vgoodk (denoted as Vgood,min) decreases to Vset, when the output of the integrator 710 that corresponds to Vgood,min (denoted as Voutset,min) stops decreasing while the outputs of other integrators continue to decrease. In general, the output voltage of the voltage selector 712 is not completely determined by Voutset,min by coincidence, so it will continue to decrease, resulting in a continuing decrease of Vout and a further decrease of Vgood,min to below Vset. However, this will increase rather than decrease Voutset,min, which gradually becomes Voutset,max and prevents the decrease of the power source voltage Vout. Once the decrease of power source voltage stops, since Vgood,min is lower than Vset, the power source voltage regulator will gradually increase Vout so that Vgood,min equals Vset again. Therefore, Vgood,min, the lowest of all Vgoodk, will stabilize at the value of Vset. Other Vgoodk signals will stabilize at values greater than Vset, and the output voltages of their corresponding integrators will continually decrease until they reach the saturation value, which is significantly lower than Voutset,min. The output of the voltage selector ill be completely determined by Vout, and the influence from other integrators can be ignored. Therefore, the power source voltage Vout will reach a stable state, and its value is determined by Vset.

Figure 8:
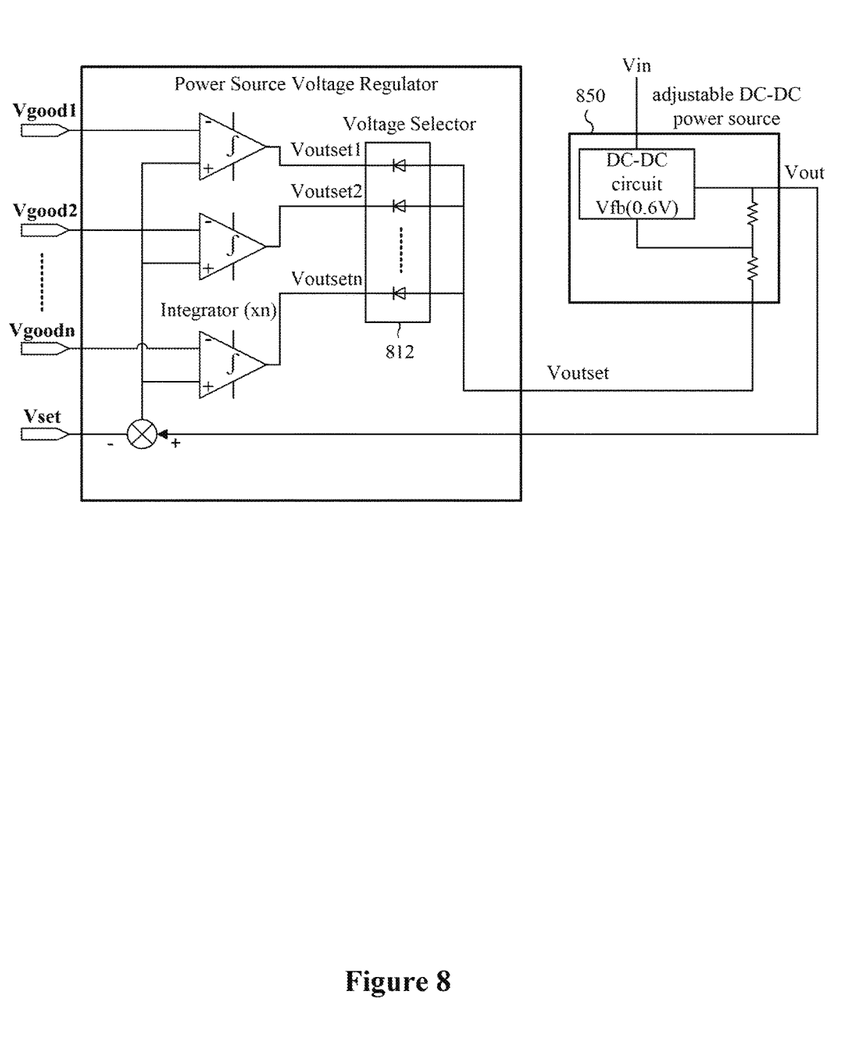
FIG. 8 is a schematic diagram of a power source voltage regulator according to an illustrated embodiment of the present disclosure.

FIG. 8 is a schematic diagram of a power source voltage regulator 800, according to another illustrated embodiment of the present disclosure. This embodiment can be used in conjunction with the embodiment of the laser device voltage regulating circuit 600 shown in FIG. 6a. The differences between the embodiments in FIG. 8 and FIG. 7 are explained below. First, the inverting buffer is removed from an adjustable DC-DC power source 850. As a result, Vout changes in the opposite direction as Voutset. Second, in this embodiment, the second preset threshold equals Vout−Vset, that is, the second preset threshold is the difference between Vout and Vset. Since the polarity of the diode array voltage selector 812 is opposite to that in the embodiment shown in FIG. 7, Voutset is determined by the lowest among Voutsetk (k =1 . . . n). Accordingly, Vgoodk is controlled so that the highest of Vgoodk equals Vout-Vset. This dynamic control process is similar to that described in the analysis of FIG. 7 above and is not described in detail here.

In some embodiments, the laser driving method disclosed herein includes: the configuration of an adjusting speed of the second controller with respect to the output voltage of the adjustable DC-DC power source to be lower than one-tenth of the speed of the optical power control loop in response to changes in the output voltage of the adjustable DC-DC power source. The optical power control loop includes a laser driving transistor (e.g., transistor 30), a laser voltage regulating circuit 40, a controlled laser (e.g., LD1 20), and a photoelectric current detecting device (e.g., MPD). When the optical power control loop functions properly, the laser's output optical power is stabilized at its set value. When the output voltage of the adjustable DC-DC power source changes, the output of the first controller in the optical power control loop will change as the power source voltage changes, stabilizing the laser's output optical power. However, if power source voltage changes too quickly— quicker than the speed of the first controller to respond to changes in the power source voltage—then the laser output power will experience a significant transient change, which falls out of the allowed range of optical power change under normal operating conditions. Preferably, in this embodiment, the adjusting speed of the second controller for the power source voltage is configured to be lower than one-tenth of the first controllers speed to respond to changes in the powersource voltage, so the power source voltage regulating process of the second controller will have negligible interference with the optical power control loop.

Although the goal for the power source voltage regulator as described in FIGS. 7 and 8 is to make the maximum or minimum among the power source voltage state indicator signals equal a preset value to optimize the power consumption by the power source, in some embodiments, the function of the power source voltage regulator can be simplified to the extent desirable, so that the output voltage of the adjustable DC-DC power source can be adjusted in a less precise manner (e.g., using a digital-to-analog converter to set Voutset, and following a certain step size when increasing or decreasing Vout), at the same time the power source voltage state indicator signal Vgoodk is compared to the first preset threshold or the second preset threshold until all Vgoodk are greater than the first threshold or less than the second preset threshold, without requiring them to be equal to the first preset threshold or second preset threshold. In this way, Voutput can be adjusted to enable proper operation of all lasers while the power consumption is suboptimal. These techniques and methods are consistent with the principle of this disclosure and should fall within this invention's scope of protection.

Although in the drawings the operations associated with the disclosed method are described in a specific sequence, this neither requires or implies that these operations must follow such specific sequence, nor requires or implies that the expected outcome could only be achieved when all operations shown are carried out. On the contrary, the steps described in the flowcharts may be carried out in a different sequence. Additionally or optionally, certain steps can be omitted, multiple steps can be combined into one in implementation, and/or one step can be separated into multiple steps in implementation.

The invention is not limited to the details of the illustrated embodiment described above, and the invention can be realized in other embodiments without going astray from the spirit or basic characteristics of the invention. Therefore, the embodiments should be considered as illustrative and non-limiting, and the scope of the invention is defined by the claims rather than the descriptions above; all variations that fall within the meaning and scope of equivalent elements of the claims are covered by the invention. No figures or markings in the claims should be deemed as limiting the relevant claims. In addition, the word "comprise" or "include" does not preclude other parts, units, or steps, and a word in its singular form does not preclude its plural form. Multiple parts, units, or apparatuses stated in the claim can also be realized in one part, unit, or apparatus through software or hardware.

The laser driver, driving method, and high-speed optical module provided in this invention use an adjustable DC-DC power source and its corresponding control circuit to drive the laser; they can be used for lasers of all parameters and in all of their working states. The power consumed by the laser driving circuit can reach an ideal value by modifying the output voltage of the adjustable DC-DC power source. In addition, the laser driver and driving method disclosed herein can be applied to multichannel high-speed optical modules. Therefore, the implementation of this disclosure can optimize the power consumption of the optical module, especially the power consumption of the laser driving circuit.

The embodiments disclosed above are only some of the embodiments of this invention. These embodiments shall

What is claimed is:

1. A laser driver for driving a laser, comprising:
an adjustable DC-DC power source;
an optical power control loop; and
a power source voltage regulator,
wherein:
said adjustable DC-DC power source is coupled to said optical power control loop and said power source voltage regulator, in order to provide a working current for said laser, and an output voltage of said adjustable DC-DC power source changes as a power source setting voltage changes;
said optical power control loop is configured to adjust an output optical power of the laser to a set value for optical power by adjusting a working voltage of the laser, and to generate a power source voltage state indicator voltage;
said power source voltage regulator is used to generate the power source setting voltage, so that said power source voltage state indicator voltage is greater than or equal to a first preset threshold, or less than or equal to a second preset threshold;
said optical power control loop comprises a laser driving transistor and a laser voltage regulating circuit;
said laser driving transistor is coupled in series between said adjustable DC-DC power source and the laser, to adjust a voltage drop across said laser driving transistor by adjusting a base voltage or a gate voltage of said laser driving transistor, in order to change the output optical power of the laser;
said laser voltage regulating circuit is coupled to the laser, said laser driving transistor, and said power source voltage regulator, to detect said output optical power and generate said base voltage or said gate voltage of said laser driving transistor based on the detected output optical power; and
said power source voltage state indicator voltage is generated by said laser driving transistor or said laser voltage regulating circuit.

2. The laser driver according to claim 1, wherein:
said first preset threshold or said second preset threshold is determined based on a threshold setting signal; and
the value of said threshold setting signal enables said output voltage to be a minimum voltage needed to ensure normal operation of the laser.

3. A laser driving method for driving a laser, comprising:
providing an adjustable DC-DC power source coupled to a first controller and a second controller;
providing, by said adjustable DC-DC power source, a working current for the laser, an output voltage of the adjustable DC-DC power source changing as a power source setting voltage changes;
adjusting, by said first controller, an output optical power of the laser to a set value of the optical power by adjusting a working voltage of the laser, and generating a power source voltage state indicator voltage; and
causing, by said second controller, said power source voltage state indicator voltage to be greater than or equal to a first preset threshold, or less than or equal to a second preset threshold, by adjusting said output voltage,
wherein the laser includes a plurality of laser devices,
the method further comprising:
generating, by the first controller, a plurality of power source voltage state indicator voltages respectively corresponding to the plurality of laser devices and a plurality of integrators included in the second controller and respectively corresponding to the plurality of laser devices, each one of said power source voltage state indicator voltages changes in the same direction as said output voltage of the adjustable DC-DC power source, and when said power source voltage state indicator voltage is greater than or equal to said first preset threshold, an optical power control loop operates normally;
integrating, by each one of said integrators, a difference between said first preset threshold and a corresponding one of said power source voltage state indicator voltages;
selecting, by a voltage selector included in the second controller, the highest among output voltages of said integrators to set said power source setting voltage, said output voltage of the adjustable DC-DC power source changes in the same direction as the power source setting voltage; and
continually adjusting, by said integrators, said output voltage until said power source voltage state indicator voltages are greater than or equal to said first preset threshold.

4. A laser driving method for driving a laser, comprising:
providing an adjustable DC-DC power source coupled to a first controller and a second controller;
providing, by said adjustable DC-DC power source, a working current for the laser, an output voltage of the adjustable DC-DC power source changing as a power source setting voltage changes;
adjusting, by said first controller, an output optical power of the laser to a set value of the optical power by adjusting a working voltage of the laser, and generating a power source voltage state indicator voltage; and
causing, by said second controller, said power source voltage state indicator voltage to be greater than or equal to a first preset threshold, or less than or equal to a second preset threshold, by adjusting said output voltage,
wherein:
the laser includes a plurality of laser devices;
the method further comprising:
generating, by said first controller, a plurality of power source voltage state indicator voltages respectively corresponding to the plurality of laser devices and a plurality of integrators included in the second controller and respectively corresponding to the plurality of laser devices, each one of said power source voltage state indicator voltages changes in the same direction as said output voltage of the adjustable DC-DC power source, and an optical power control loop operates normally when said power source voltage state indicator voltage is less than or equal to said second preset threshold;
integrating, by each one of said integrators, a difference between said second preset threshold and a corresponding one of said power source voltage state indicator voltages;

selecting, by a voltage selector included in the second controller, the lowest among output voltages of said integrators to set said power source setting voltage, said output voltage of the adjustable DC-DC power source changes in the opposite direction as the power source setting signal; and continually adjusting, by said integrators, said output voltage of the adjustable DC-DC power source until said power source voltage state indicator voltage is less than or equal to said second preset threshold.

5. The driving method according to claim 3, further comprising:

determining said first preset threshold or said second preset threshold based on a threshold setting signal, the value of said threshold setting signal enables said output voltage to be a minimum voltage needed to ensure the normal operation of said first controller.

6. The driving method according to claim 3, further comprising:

configuring an adjusting speed of said second controller for said adjustable DC-DC power source output voltage to be lower than one-tenth of a speed of said first controller to respond to changes in the output voltage of said adjustable DC-DC power source.

7. A high-speed optical module, which comprises a laser array made up of multiple lasers, wherein:

one or more of said multiple lasers are driven by the laser driver of claim 1.

* * * * *